(12) United States Patent
Lin

(10) Patent No.: US 10,622,388 B2
(45) Date of Patent: Apr. 14, 2020

(54) ARRAY SUBSTRATE SENSOR AND DETECTION DEVICE

(71) Applicants: BOE TECHNOLOGY GROUP CO., LTD., Beijing (CN); KA IMAGING INC., Kitchener, Ontario (CA)

(72) Inventor: Chia Chiang Lin, Beijing (CN)

(73) Assignees: BOE TECHNOLOGY GROUP CO., LTD., Beijing (CN); KA IMAGING INC., Kitchener (CA)

( * ) Notice: Subject to any disclaimer, the term of this patent is extended or adjusted under 35 U.S.C. 154(b) by 0 days.

(21) Appl. No.: 16/249,251

(22) Filed: Jan. 16, 2019

(65) Prior Publication Data

US 2019/0165007 A1 May 30, 2019

Related U.S. Application Data

(62) Division of application No. 15/544,704, filed as application No. PCT/CN2017/070747 on Jan. 10, 2017, now Pat. No. 10,224,353.

(30) Foreign Application Priority Data

Apr. 13, 2016 (CN) .......................... 2016 1 0229060

(51) Int. Cl.
*H01L 23/00* (2006.01)
*H01L 27/00* (2006.01)
(Continued)

(52) U.S. Cl.
CPC .... *H01L 27/1443* (2013.01); *H01L 21/31111* (2013.01); *H01L 21/31116* (2013.01);
(Continued)

(58) Field of Classification Search
CPC ..... H01L 31/022483; H01L 31/022475; H01L 31/1884; H01L 31/202; H01L 27/1443;
(Continued)

(56) References Cited

U.S. PATENT DOCUMENTS 6,806,472 B2    10/2004   Yoon et al.
7,006,179 B2    2/2006    Kim
(Continued)

FOREIGN PATENT DOCUMENTS

CN          1748314 A      3/2006
CN        105720063 A      6/2016
(Continued)

OTHER PUBLICATIONS

The First Chinese Office Action dated Dec. 20, 2017; Appln. No. 201610229060.X.
(Continued)

*Primary Examiner* — Nikolay K Yushin
(74) *Attorney, Agent, or Firm* — Ladas & Parry LLP

(57) ABSTRACT

Disclosed are an array substrate, a manufacturing method thereof, a sensor and a detection device. The array substrate includes: a base substrate; a thin-film transistor (TFT) being disposed on the base substrate and including a source electrode and an active layer; a passivation layer disposed on the TFT; a first metal layer disposed on the passivation layer; an insulating layer disposed on the first metal layer; a through hole structure running through the insulating layer, the first metal layer and the passivation layer; and a detection unit being disposed on the insulating layer and including a second metal layer, wherein the second metal layer makes direct contact with the source electrode via the through hole structure.

11 Claims, 6 Drawing Sheets

(51) Int. Cl.
*H01L 29/00* (2006.01)
*H01L 31/00* (2006.01)
*H01L 27/144* (2006.01)
*H01L 21/311* (2006.01)
*H01L 27/12* (2006.01)
*H01L 21/3213* (2006.01)
*H01L 21/768* (2006.01)
*H01L 23/31* (2006.01)
*H01L 29/45* (2006.01)
*H01L 29/49* (2006.01)
*H01L 29/786* (2006.01)
*H01L 31/0224* (2006.01)
*H01L 31/18* (2006.01)
*H01L 31/20* (2006.01)
*H01L 21/027* (2006.01)

(52) U.S. Cl.
CPC .. *H01L 21/32134* (2013.01); *H01L 21/76802* (2013.01); *H01L 23/3171* (2013.01); *H01L 27/12* (2013.01); *H01L 27/124* (2013.01); *H01L 27/1248* (2013.01); *H01L 27/1259* (2013.01); *H01L 27/1262* (2013.01); *H01L 29/45* (2013.01); *H01L 29/4908* (2013.01); *H01L 29/78633* (2013.01); *H01L 31/022475* (2013.01); *H01L 31/022483* (2013.01); *H01L 31/1884* (2013.01); *H01L 31/202* (2013.01); *H01L 21/0273* (2013.01); *Y02E 10/50* (2013.01); *Y02P 70/521* (2015.11)

(58) Field of Classification Search
CPC ............. H01L 27/1262; H01L 27/1248; H01L 27/124; H01L 27/1259; H01L 27/12; H01L 23/3171; Y02E 10/50 Y02P 70/521
See application file for complete search history.

(56) References Cited

U.S. PATENT DOCUMENTS

| | | | |
|---|---|---|---|
| 7,479,655 | B2 | 1/2009 | Arasawa et al. |
| 7,535,506 | B2 | 5/2009 | Nomura et al. |
| 2003/0010922 | A1 | 1/2003 | Yoon et al. |
| 2003/0128329 | A1 | 7/2003 | Kim |
| 2006/0062352 | A1 | 3/2006 | Nomura et al. |
| 2012/0309136 | A1 | 12/2012 | Zhou et al. |
| 2013/0001573 | A1 | 1/2013 | Lee et al. |
| 2015/0364626 | A1* | 12/2015 | Lim ................ H01L 31/022466 136/256 |

FOREIGN PATENT DOCUMENTS

| | | |
|---|---|---|
| CN | 105789324 A | 7/2016 |
| CN | 205488128 U | 8/2016 |
| CN | 205508828 U | 8/2016 |
| KR | 20050103291 A | 10/2005 |
| KR | 100531046 B1 | 11/2005 |
| KR | 1020130006999 A | 1/2013 |
| KR | 101344980 B1 | 12/2013 |

OTHER PUBLICATIONS

Korean Office Action dated Nov. 21, 2018; Appln. No. 10-2017-7026551.
USPTO RR dated Mar. 22, 2018 in connection with U.S. Appl. No. 15/544,704.
USPTO NFOA dated Jun. 13, 2018 in connection with U.S. Appl. No. 15/544,704.
USPTO NOA mailed Oct. 15, 2018 in connection with U.S. Appl. No. 15/544,704.
The International Search Report and Written Opinion dated Apr. 13, 2017; PCT/CN2017.070747.
KIPO Grant of Patent dated May 20, 2019; Appln, No. 10-2017-7026551.

* cited by examiner

Forming a TFT on a base substrate, in which the TFT includes a source electrode and an active layer

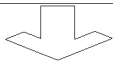

Depositing a passivation layer film and a first metal layer film on the TFT in sequence

Forming a first metal layer, a passivation layer, and a first connecting hole and a recess disposed in the first metal layer and the passivation layer by performing first patterning process on the first metal layer film and the passivation layer film, in which one part of the source electrode is exposed by the first connecting hole, and the first metal layer is disconnected at the recesses to form different parts spaced from each other

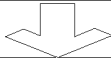

Forming an insulating layer film on the first metal layer, the passivation layer, the first connecting hole and the recess, and forming an insulating layer pattern and a second connecting hole by second patterning process, in which the first connecting hole and the second connecting hole are communicated with each other to form a through hole structure

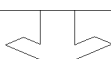

Forming a detection unit on the base substrate provided with the through hole structure, in which the detection unit includes a second metal layer which makes direct contact with the source electrode via the through hole structure

FIG. 5

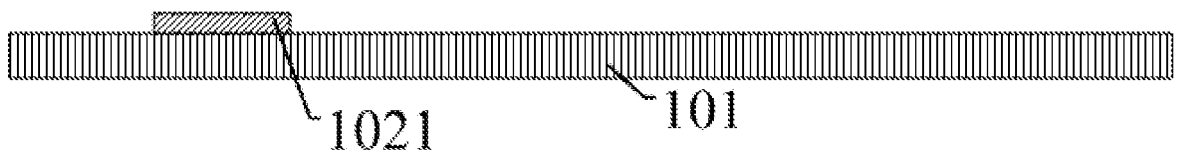

FIG. 6a

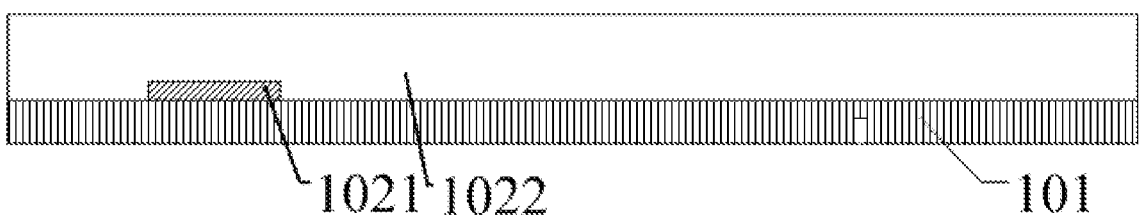

FIG. 6b

ARRAY SUBSTRATE SENSOR AND DETECTION DEVICE

TECHNICAL FIELD

Embodiments of the present invention relate to an array substrate, a manufacturing method thereof, a sensor and a detection device.

BACKGROUND

Photoelectric sensors are widely applied in detection and control due to the advantages of high precision, rapid response, non-contact, numerous measurable parameters, simple structure, etc. For example, the photoelectric sensor may be applied in the aspects of smoke and dust turbidity monitors, bar code scanning pens, product counters, photoelectric smoke alarms, rotation speed measuring instruments, laser weapons, etc.

The photoelectric sensor comprises an array substrate. The array substrate includes thin-film transistors (TFTs) and photodiodes. The photodiodes receive light and convert optical signals into electrical signals via photovoltaic effect, respectively control the storage and read of the electrical signals by switching off and on the TFTs, and hence achieve the function of detection or control. Thus, the performances of the TFTs are very important in the photoelectric sensor. Signal interference and light leakage are key factors for affecting the performances of the TFTs.

In order to obtain better signal-to-noise ratio (SNR), a signal shielding metal layer is usually additionally arranged on the TFTs of the photoelectrical sensor, and subsequently, a stabilized voltage is applied to the signal shielding metal layer to shield the induction current produced by electrical fields of sensing electrodes on source electrodes and drain electrodes, so that the influence on the performances of the TFTs can be reduced. But this type of sensor uses numerous layers in the manufacturing process, has many process steps, and hence increases the production cost.

SUMMARY

At least one embodiment of the present invention provides an array substrate, a manufacturing method thereof, a sensor and a detection device. The array substrate may be applied to the sensor and the detection device. In the manufacturing process of the array substrate, a first metal layer and a passivation layer may be patterned in the same patterning process, so the production processes are merged and production is convenient, and meanwhile, the production cost is saved.

At least one embodiment of the present invention provides an array substrate, comprising: a base substrate; a thin-film transistor (TFT) being disposed on the base substrate and including a source electrode and an active layer; a passivation layer disposed on the TFT; a first metal layer disposed on the passivation layer; an insulating layer disposed on the first metal layer; a through hole structure running through the insulating layer, the first metal layer and the passivation layer; and a detection unit being disposed on the insulating layer and including a second metal layer, wherein the second metal layer makes direct contact with the source electrode via the through hole structure.

For example, in an array substrate provided by one embodiment of the disclosure, the array substrate further comprises a recess running through the first metal layer and the passivation layer and being disposed between the through hole structure and the active layer in a direction parallel to the base substrate, in which the first metal layer is disconnected at the recess to form different parts spaced from each other.

For example, in an array substrate provided by one embodiment of the disclosure, a projection of the first metal layer on the base substrate is at least partially overlapped with a projection of the TFT on the base substrate.

For example, in an array substrate provided by one embodiment of the disclosure, the detection unit further includes a bias electrode spaced from the second metal layer, and a semiconductor layer making contact with both the second metal layer and the bias electrode.

For example, in an array substrate provided by one embodiment of the disclosure, a transparent conductive layer is disposed on the second metal layer.

For example, in an array substrate provided by one embodiment of the disclosure, the transparent conductive layer has a thickness greater than that of the second metal layer.

For example, in an array substrate provided by one embodiment of the disclosure, the transparent conductive layer includes any one of indium tin oxide (ITO) or indium zinc oxide (IZO).

For example, in an array substrate provided by one embodiment of the disclosure, a material of the insulating layer is any one of organic resin, silicon nitride or silicon oxide.

For example, in an array substrate provided by one embodiment of the disclosure, the thickness of the insulating layer is 1-4 µm.

For example, in an array substrate provided by one embodiment of the disclosure, the material of the first metal layer and the second metal layer is any one or a combination of molybdenum (Mo), aluminum (Al) and copper (Cu).

At least one embodiment of the invention further provides a sensor, comprising the array substrate according to any embodiment of the invention.

At least one embodiment of the invention further provides a detection device according to any embodiment of the invention.

At least one embodiment of the invention further provides a method for manufacturing an array substrate, comprising: forming a thin film transistor (TFT) on a base substrate, in which the TFT includes a source electrode and an active layer; depositing a passivation layer film and a first metal layer film on the TFT in sequence; forming a first metal layer, a passivation layer, and a first connecting hole and a recess disposed in the first metal layer and the passivation layer by performing a first patterning process on the first metal layer film and the passivation layer film, in which a part of the source electrode is exposed by the first connecting hole, and the first metal layer is disconnected at the recess to form different parts spaced from each other; forming an insulating layer film on the first metal layer, the passivation layer, the first connecting hole and the recess, and forming a insulating layer pattern and a second connecting hole by a second patterning process, in which the first connecting hole and the second connecting hole are communicated with each other to form a through hole structure; and forming a detection unit on the base substrate provided with the through hole structure, in which the detection unit includes a second metal layer which makes direct contact with the source electrode via the through hole structure.

For example, in a method for manufacturing an array substrate according to one embodiment of the invention, in the first patterning process, the first metal layer film and the passivation layer film are etched by adoption of a first etching agent.

For example, in a method for manufacturing an array substrate according to one embodiment of the invention, in the first patterning process, the first metal layer film and the passivation layer film are respectively etched by a second etching agent and a third etching agent.

For example, in a method for manufacturing an array substrate according to one embodiment of the invention, the recess is disposed between the through hole structure and the active layer in the direction parallel to the base substrate.

For example, in a method for manufacturing an array substrate according to one embodiment of the invention, a projection of the first metal layer on the base substrate is at least partially overlapped with a projection of the TFT on the base substrate.

For example, in a method for manufacturing an array substrate according to one embodiment of the invention, the method further comprises: forming a transparent conductive layer on the second metal layer.

For example, in a method for manufacturing an array substrate according to one embodiment of the invention, the transparent conductive layer includes any one of ITO or IZO.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 5 is a flow diagram of a method for manufacturing an array substrate, provided by an embodiment of the present invention; and FIGS. 6a-6j are schematic sectional views illustrating different stages of the manufacturing process of the array substrate provided by an embodiment of the present invention.

REFERENCE NUMERALS OF THE ACCOMPANYING DRAWINGS

Figure 1:
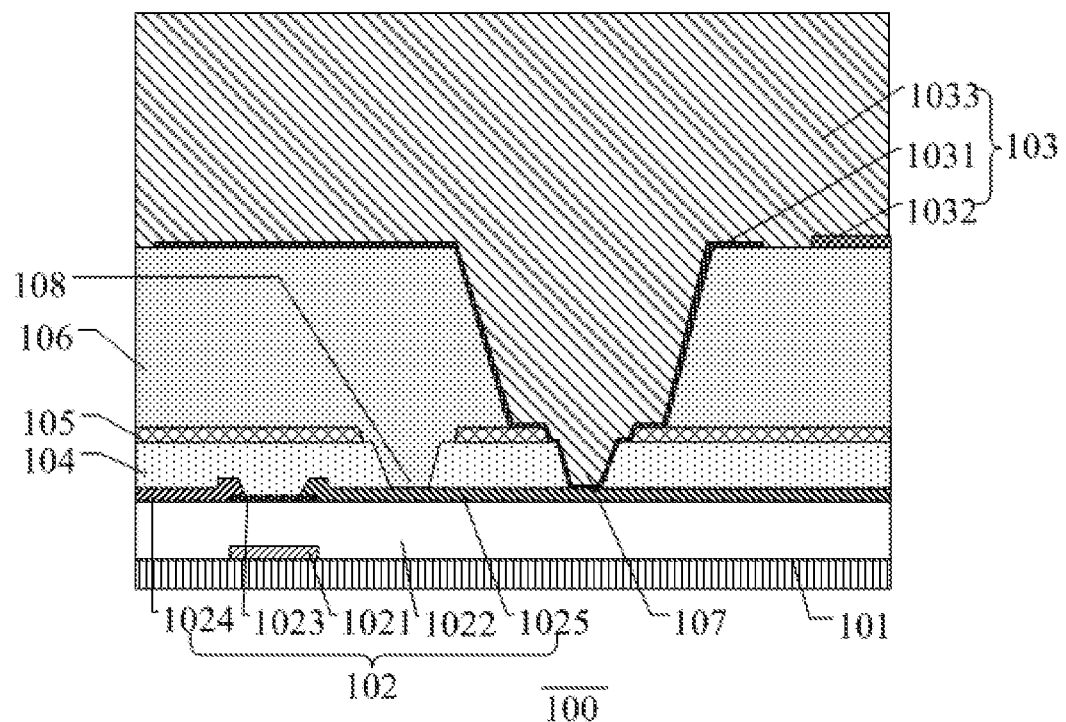
FIG. 1 is a schematic sectional view of an array substrate provided by an embodiment of the present invention.

100—array substrate; 101—base substrate; 102—TFT; 1021—gate electrode; 1022—gate insulating layer; 1023—active layer; 1024—drain electrode; 1025—source electrode; 103—detection unit; 1031—second metal layer; 1032—bias electrode; 1033—semiconductor layer; 1034—transparent conductive layer; 104—passivation layer; 104'—passivation layer film; 105—first metal layer; 105'—first metal layer film; 106—insulating layer; 106'—insulating layer film; 107—through hole structure; 1071—first connecting hole; 1072—second connecting hole; 108—recess; 201—first size; 202—second size; 203—third size; 204—first step; 205—second step.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, the technical terminology or scientific terminology used herein should have the general meanings understood by those skills in the art to which the present invention belongs. The "first", "second" and similar words used in the present invention application specification and claims do not mean any sequence, amount or importance, but are merely used to distinguish different components. The word "comprise", "include" or the like only indicates that an element or a component before the word contains elements or components listed after the word and equivalents thereof, not excluding other elements or components. "Connecting" or "connected" and similar words are not limited to the physical or mechanical connection, but may comprise electrical connection, no matter directly or indirectly. "Over", "under" and the like are merely used to denote the relative location relationship, and the relative location relationship can be changed when the absolute location is changed.

At least one embodiment of the present invention provides an array substrate, which comprises: a base substrate; a TFT being disposed on the base substrate and including a source electrode and an active layer; a passivation layer disposed on the TFT; a first metal layer disposed on the passivation layer; an insulating layer disposed on the first metal layer; a through hole structure running through the insulating layer, the first metal layer and the passivation layer; and a detection unit being disposed on the insulating layer and including a second metal layer, in which the second metal layer makes direct contact with the source electrode via the through hole structure.

The array substrate may be applied in a sensor and a detection device. In the manufacturing process of the array substrate, the first metal layer and the passivation layer may be patterned in the same patterning process. For example, one patterning process may include the steps such as photoresist coating, exposure and development, one or more etching processes, and photoresist removal. The embodiment of the present invention merges the production processes, is convenient in production, and meanwhile saves the production cost.

Description will be given below with reference to several embodiments.

First Embodiment

The embodiment provides an array substrate. FIG. 1 is a schematic sectional view of an array substrate provided by one embodiment of the present invention. The array substrate 100 comprises: a base substrate 101; a TFT 102 being disposed on the base substrate 101 and including a source electrode 1025 and an active layer 1023; a passivation layer 104 disposed on the TFT 102; a first metal layer 105 disposed on the passivation layer 104; an insulating layer 106 disposed on the first metal layer 105; a through hole structure 107 running through the insulating layer 106, the first metal layer 105 and the passivation layer 104; and a detection unit 103 being disposed on the insulating layer 106 and including a second metal layer 1031, in which the second metal layer 1031 makes direct contact with the source electrode 1025 via the through hole structure 107.

For example, as illustrated in FIG. 1, the array substrate further comprises: a recess 108 running through the first metal layer 105 and the passivation layer 104 and being disposed between the through hole structure 107 and the active layers 1023 in the direction parallel to the base substrate 101, in which the first metal layer 105 is disconnected at the recess 108 to form different parts spaced from each other. The recess 108 is formed above the source electrode 1025. The first metal layer 105 may form a first part disposed near the through hole structure 107 and a second part spaced from the first part after being disconnected at the recess 108. That is to say, the recess 108 divide the first metal layer 105 into different parts spaced from each other. The first part and the second part, spaced from each other, of the first metal layer 105 are not electrically connected. The first part of the first metal layer 105 may help the second metal layer 1031 and the source electrode 1025 to be better conducted at the through hole structure 107; and a stabilized voltage may be applied to the second part of the first metal layer 105 to reduce the influence of electrical fields of the second metal layer 1031 on the TFT 102, and meanwhile, shield light for the TFT 102.

For example, as illustrated in FIG. 1, the TFT 102 also includes a gate electrode 1021, a gate insulating layer 1022 covering the gate electrode 1021, and a drain electrode 1024. A stabilized voltage may be applied to the second part of the first metal layer 105 to shield the induction current produced by the electrical fields of the second metal layer 1031 on the drain electrode 1024, the source electrode 1025 and a data line connected with the drain electrode 1024, so as to reduce the influence of the electrical fields of the second metal layer 1031 on the TFT 102.

For example, as illustrated in FIG. 1, a projection of the first metal layer 105 on the base substrate 101 is at least partially overlapped with a projection of the TFT 102 on the base substrate 101, and the projection of the first metal layer 105 on the base substrate 101 at least covers projections of the drain electrode 1024 and the active layer 1023 on the base substrate. The ratio of the on-state current to the off-state current of the TFT is generally required to be $10^7$ or more. As illumination will severely affects the switching characteristic of the TFT, the ratio of the on-state current to the off-state current in the above requirement can only be satisfied by shielding light for active units of the TFT, so it is necessary to shield the active layer 1023 at least. Thus, the projection of the first metal layer 105 on the base substrate 101 at least covers the projection of the active layer 1023 on the base substrate. Meanwhile, the first metal layer 105 can shield the induction current on the drain electrode 1024, so the projection of the first metal layer 105 on the base substrate 101 at least covers the projection of the drain electrode 1024 on the base substrate.

The detection unit 103 can further includes a bias electrode 1032 spaced from the second metal layer 1031, and a semiconductor layer 1033 making contact with both the second metal layer 1031 and the bias electrode 1032. The spaced arrangement here refers to that the second metal layer 1031 and the bias electrode 1032 do not make direct contact. The structure of side-by-side arrangement of the second metal layer 1031 and the bias electrode 1032 in the direction parallel to the base substrate 101 can be adopted, or the structure of parallel arrangement of the second metal layer 1031 and the bias electrode 1032 in the direction perpendicular to the base substrate 101 can be adopted, that is, the semiconductor layer is sandwiched between the second metal layer 1031 and the bias electrode 1032.

For example, the structure as illustrated in FIG. 1 is the structure of side-by-side arrangement of the second metal layer 1031 and the bias electrode 1032 in the direction parallel to the base substrate 101. In the structure of side-by-side arrangement here, an amorphous silicon (a-Si) semiconductor layer may be disposed on the second metal layer 1031 and the bias electrode 1032 and in an interval region between the second metal layer and the bias electrode, or an insulating film may be further disposed on the second metal layer 1031 and the bias electrode 1032. The insulating film can prevent the second metal layer 1031 and the bias electrode 1032 from being oxidized, and meanwhile, the insulating film may also make electrons and holes separate from each other more clearly. The bias electrode 1032 is completely covered by the a-Si semiconductor layer. When the bias electrode 1032 receives a high voltage electrical signal, the bias electrode 1032 may apply high voltage to the a-Si semiconductor layer. When the a-Si semiconductor layer is irradiated by visible light, the a-Si semiconductor layer may convert optical signals into electrical signals; the electrical signals are transmitted to the TFT 102 by the connection between the second metal layer 1031 and the source electrodes 1025 of the TFT 102 at the through hole structure 107; and the output of the electrical signals is controlled by the TFT 102. In the structure of side-by-side arrangement, the material of the bias electrode 1032 may be metal and may also be other conductive materials. The light transmittance of the bias electrode 1032 is not limited. For example, the material of the bias electrode 1032 may be a conductive metal such as Mo, Al and Cu or an alloy formed by any combination thereof; and the material of the bias electrode 1032 may also be conductive materials such as indium tin oxide (ITO), aluminum zinc oxide (AZO), indium zinc oxide (IZO), conductive resin, graphene film and carbon nanotube film.

Figure 2:
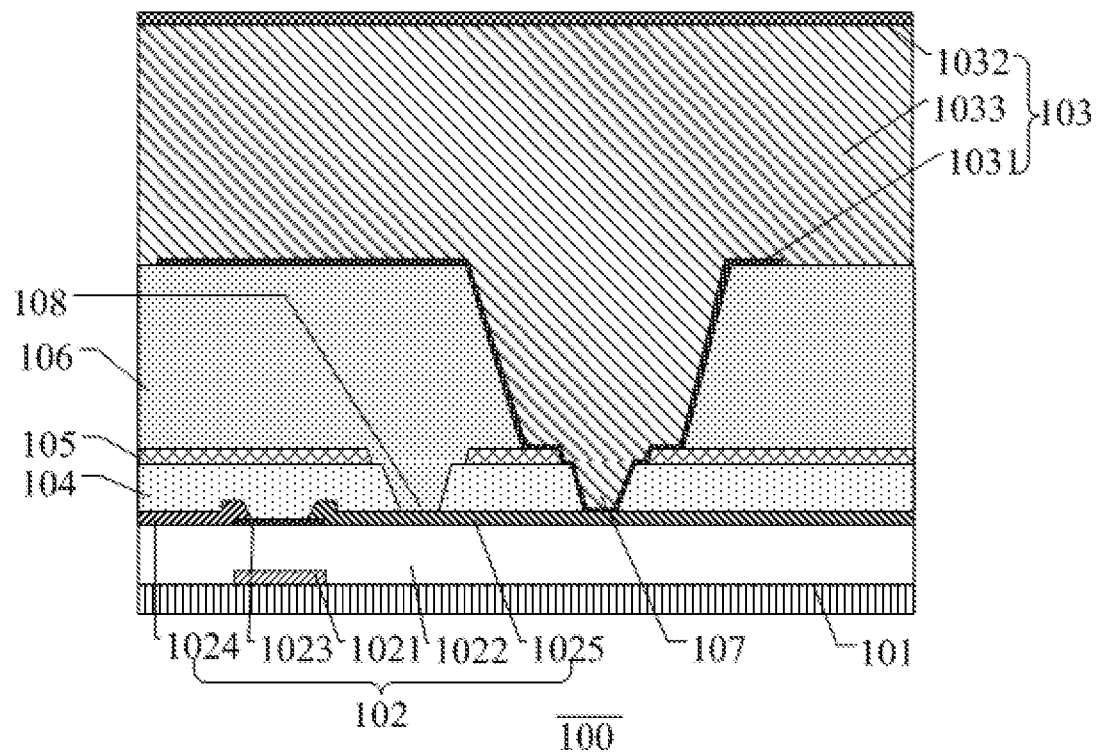
FIG. 2 is a schematic sectional view of an array substrate provided by an example of the present invention.

For example, FIG. 2 is a schematic sectional view of an array substrate provided by one example of the present invention. The structure as illustrated in FIG. 2 is the structure of parallel arrangement of the second metal layer 1031 and the bias electrode 1032 in the direction perpendicular to the base substrate 101, namely the semiconductor layer 1033 is disposed on the second metal layer 1031, and the bias electrode 1032 is disposed on the semiconductor layer 1033. At this point, in order to ensure that the semiconductor layer 1033 is able to receive light, the bias electrode 1032 is transparent conductive materials, for example, may be made from materials such as ITO, IZO, AZO, conductive resin, graphene film and carbon nanotube film.

For example, in the structure as illustrated in FIGS. 1 and 2, the thickness of the second metal layer 1031 is 0.03-0.06 µm, e.g., 0.05 µm; and the thickness of the bias electrode 1032 is 0.05-0.1 µm, e.g., 0.08 µm.

Figure 3:
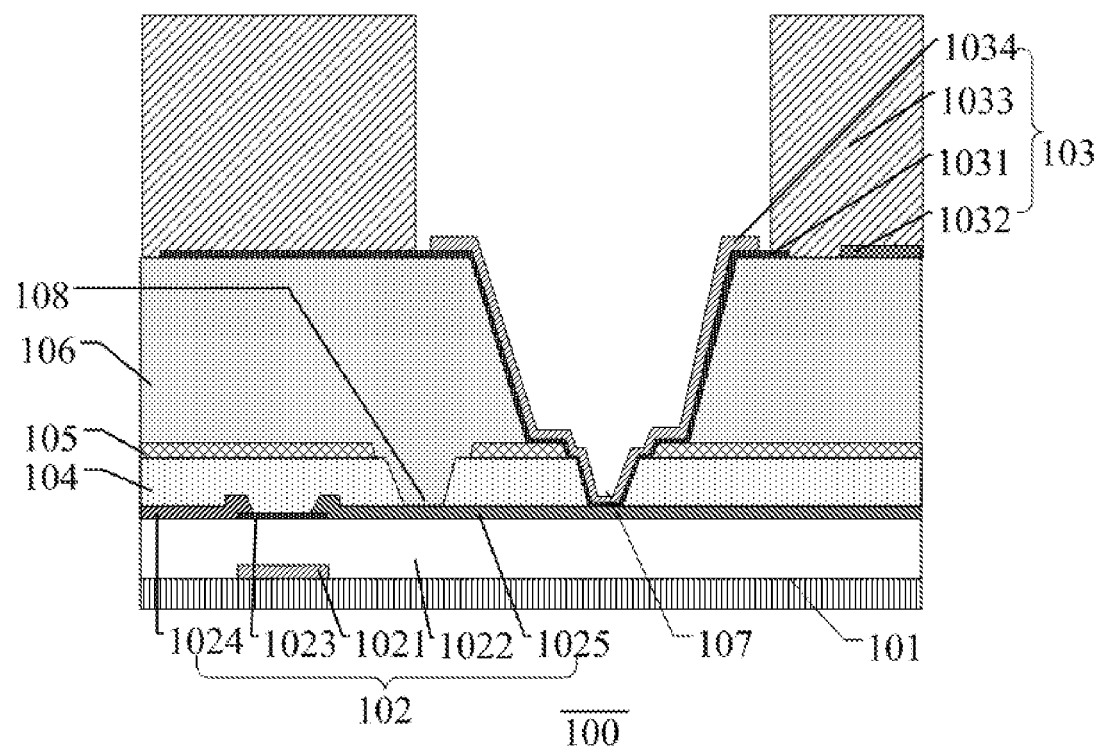
FIG. 3 is a schematic sectional view of an array substrate provided by an example of the present invention.

For example, as illustrated in FIG. 3, a transparent conductive layer 1034 may be further disposed on the second metal layer 1031. The transparent conductive layer 1034 has good flexibility and high electrical conductivity and can ensure normal conduction of electrical signals. In the case of signal transmission, as the high voltage applied to the bias electrode 1032 will interfere with the electrical signals of the TFTs, an insulating layer 106 with high thickness is additionally arranged on the TFT, and meanwhile, the first metal layer 105 is arranged to shield miscellaneous signals on the TFT. In order to obtain low noise for the detection unit, the thickness of the sensing electrode, namely the second metal layer 1031, is required to be low, and the thin second metal layer 1031 can reduce the possible area of current leakage and reduce leakage current. When the second metal layer 1031 is communicated with the TFT through the thick insulating layer, due to the physical structure of the thick insulating layer and the low thickness of the second metal layer 1031, the second metal layer 1031 can be easily broken to result in the problem of poor conduction, and particularly the second metal layer 1031 can be easily broken at corners. When the transparent conductive layer 1034 is disposed on the second metal layer 1031, the problem of non-conduction due to the broken second metal layer 1031 can be avoided.

Meanwhile, in the entire manufacturing process, in order to prevent electrodes in a peripheral region from being oxidized, a transparent conductive layer 1034 can be further disposed on peripheral electrodes, so no additional process is added by arrangement of the transparent conductive layer 1034 on the second metal layer 1031.

For example, FIG. 3 is a schematic sectional view of an array substrate provided by an example of the present invention. As illustrated in FIG. 3, the thickness of the transparent conductive layer 1034 is greater than that of the second metal layer 1031. For example, the thickness of the transparent conductive layer 1034 is 0.08-0.15 µm, e.g., 0.1 µm. In order to avoid the problem of non-conduction due to the broken second metal layer 1031, the transparent conductive layer 1034 is designed along patterns of the second metal layer 1031. In order to avoid current leakage and noise, the transparent conductive layer 1034 and the semiconductor layer 1033 are not directly connected.

For example, as illustrated in FIG. 3, the transparent conductive layer 1034 may be made from any one of ITO and IZO and may also be made from any one selected from transparent conductive materials such as AZO, conductive resin, graphene film and carbon nanotube film.

For example, as illustrated in FIGS. 1 to 3, the insulating layer 106 may be an organic insulating layer such as organic resin and may also be an inorganic insulating layer such as silicon nitride and silicon oxide.

For example, as illustrated in FIGS. 1 to 3, the thickness of the insulating layer 106 is 1-4 µm, e.g., 1.5 µm. The thick insulating layer 106 shields noise, and meanwhile, the thick insulating layer 106 also has the function of planarization.

For example, as illustrated in FIGS. 1 to 3, the material of the first metal layer 105 and the second metal layer 1031 is any metal or alloy selected from Mo, Al and Cu.

Figure 4:
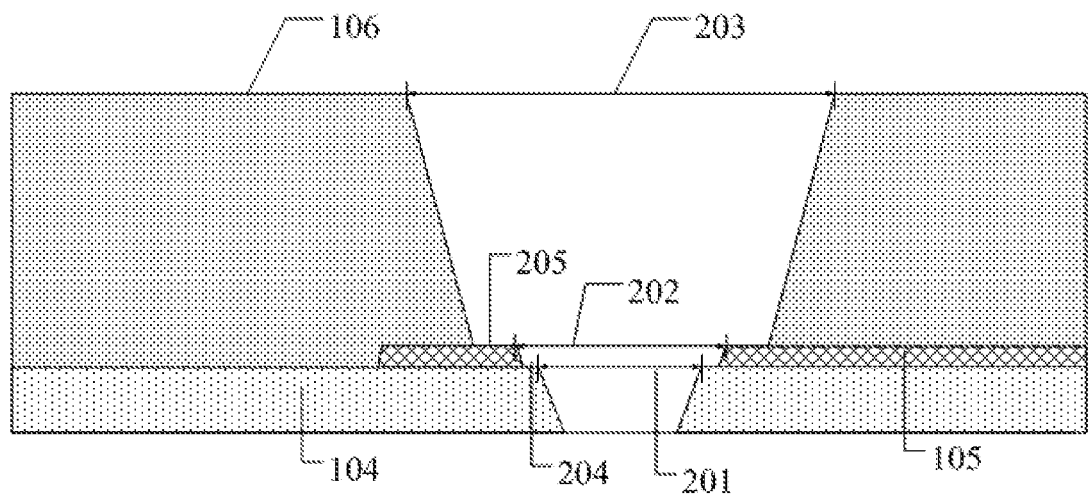
FIG. 4 is a schematic sectional view of a through hole structure in an embodiment of the present invention.

For example, in order to more clearly illustrate the characteristics of the through hole structure 107, FIG. 4 is a schematic sectional view of a through hole structure in an embodiment of the present invention. The through hole structure 107 includes a first part, a second part and a third part. The first part, the second part and the third part respectively include a first size 201, a second size 202 and a third size 203 formed on a side of the passivation layer 104, the first metal layer 105 and the insulating layer 106 away from the base substrate 101.

For example, as illustrated in FIG. 4, the first size 201 is less than or equal to the second size 202; the second sizes 202 is less than or equal to the third size 203; a first step 204 is formed between the passivation layer 104 and the first metal layer 105; and a second step 205 is formed between the first metal layer 105 and the insulating layer 106. The first step 204 and the second step 205 allow the through hole structure 107 to be smoother. Thus, the deposition of the second metal layer 1031 in FIGS. 1 to 3 can be more favorably achieved; the second metal layer 1031 can be more difficult to break; and the conductivity of the second metal layer 1031 can be improved.

Second Embodiment

The embodiment provides a sensor. The sensor is a photoelectric sensor which is a sensor for taking a photoelectrical element as a detecting element. The sensor converts measured changes from the outside into changes in the optical signals at first, and then further converts the optical signals into electrical signals via the photoelectric element. A receiver and a detection circuit of the sensor integrally include any array substrate provided by an embodiment. For example, the sensor may further include a scintillator layer or a fluorophor layer. The scintillator layer or the fluorophor layer is disposed on an end portion for receiving ray or light of a detection unit in the array substrate and configured to convert ray into light. The detection unit in the array substrate may sense the converted light and produce corresponding electrical signal. The sensor provided by the embodiment may be used for detecting different rays by selection of the type of the scintillator layer or the fluorophor layer.

Third Embodiment

The embodiment provides a detection device, which comprises a detection device and a control system, wherein the detection device includes the sensor provided by the second embodiment. For example, the detection device may be used for ray measurement and detection, industrial automatic control, photometric measurement and the like in the visible or near infrared band, and is mainly used in the aspects of missile guidance, infrared thermal imaging, infrared remote sensing and the like in the infrared band.

Fourth Embodiment

The embodiment provides a method for manufacturing an array substrate, which comprises: forming a TFT on a base substrate, in which the TFT includes a source electrode and an active layer; depositing a passivation layer film and a first metal layer film on the TFT in sequence; forming a first metal layer, a passivation layer, and a first connecting hole and a recess disposed in the first metal layer and the passivation layer by performing a first patterning process on the first metal layer film and the passivation layer film, in which a part of the source electrode is exposed by the first connecting hole, and the first metal layer is disconnected at the recess to form different parts spaced from each other; forming an insulating layer film on the first metal layer, the passivation layer, the first connecting hole and the recess, and forming a insulating layer pattern and a second connecting hole by a second patterning process, in which the first connecting hole and the second connecting hole are communicated to form a through hole structure; and forming a detection unit on the base substrate provided with the through hole structure, in which the detection unit includes a second metal layer which makes direct contact with the source electrode via the through hole structure.

For example, each patterning process may include substrate cleaning, photoresist coating, exposure, development, etching, photoresist removal (e.g., stripping), etc. FIG. 5 is a flow diagram of a method for manufacturing an array substrate, provided by an embodiment of the present invention, and illustrates the processes of the method for manufacturing the array substrate.

Figure 6C:
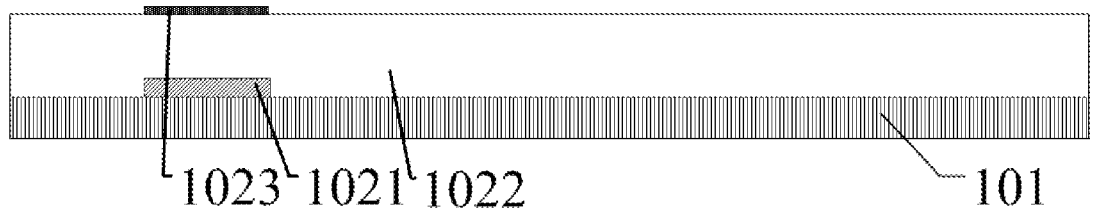

FIGS. 6a-6j are schematic sectional views illustrating different stages of the manufacturing process of the array substrate provided by an embodiment of the present invention. As illustrated in FIG. 6a, a base substrate 101 is provided; a layer of metal layer film (not illustrated) is formed on the base substrate 101; photoresist (not illustrated) is coated on the entire surface of the metal layer film; photoresist patterns corresponding to a gate electrode 1021, a gate line and the like are formed on the metal layer film by processes such as exposure and development; and the gate electrode 1021, the gate line and the like are formed on the base substrate 101 by patterning the metal layer film by adoption of the photoresist patterns as an etching mask. The base substrate 101 is a transparent insulator, and the material of the base substrate 101 includes glass, quartz or other suitable materials. The gate metal film may be made from metal such as chromium (Cr), tungsten (W), titanium (Ti), tantalum (Ta), Molybdenum (Mo), Aluminum (Al) and Copper (Cu), or an alloy thereof. The metal layer may be formed by chemical vapor deposition (CVD) or sputtering.

As illustrated in FIG. 6b, a gate insulating layer 1022 for covering the gate electrode 1021 and the gate line is formed on the base substrate provided with the gate electrode 1021, the gate line and the like, and the material of the gate insulating layer 1022 includes SiNx, SiOx or other suitable materials. The thickness of the gate insulating layer 1022 is 0.35-0.5 μm, e.g., 0.4 μm.

As illustrated in FIG. 6c, an a-Si layer, which is at least partially overlapped with the gate electrodes 1021 in the direction perpendicular to a main surface of the base substrate 101, is formed on the base substrate provided with the gate insulating layer 1022. The forming process of the a-Si layer includes: depositing an a-Si film by CVD; forming a photoresist film on the a-Si film; patterning the photoresist film by photolithography, and forming a photoresist pattern on the a-Si film; and forming an active layer 1023 by patterning the a-Si film by adoption of the photoresist pattern as an etching mask, in which the thickness of the active layer 1023 is 0.03-0.06 μm, e.g., 0.05 μm.

Figure 6D:
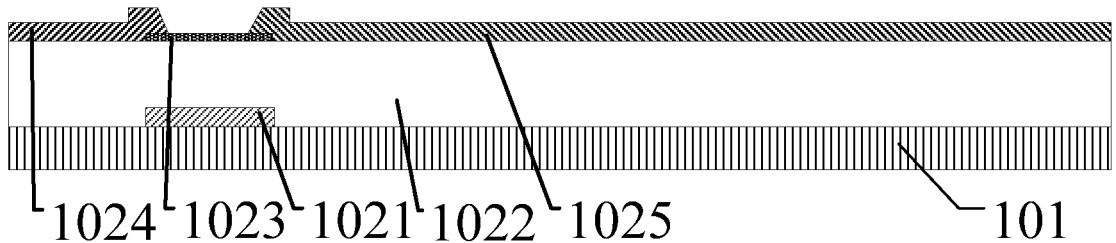

As illustrated in FIG. 6d, a source/drain metal layer film (not illustrated) is formed on a surface of the entire base substrate 101 provided with the gate electrode 1021, the gate insulating layer 1022 and the active layer 1023, for example, may be formed by CVD or sputtering. Subsequently, photoresist is coated on a surface of the source/drain metal layer film; photoresist patterns are formed on the source/drain metal layer film by processes such as exposure and development: and a source electrode 1025 and a drain electrode 1024 are formed on the insulating layer by patterning the source/drain metal layer film by adoption of the photoresist patterns as an etching mask. The source/drain metal layer may be a single-layer film of aluminum-neodymium alloy (AlNd), tungsten-molybdenum alloy (WMo), Al, Cu, Mo or Cr, and may also be a composite film formed by any combination of these metallic materials.

Figure 6E:
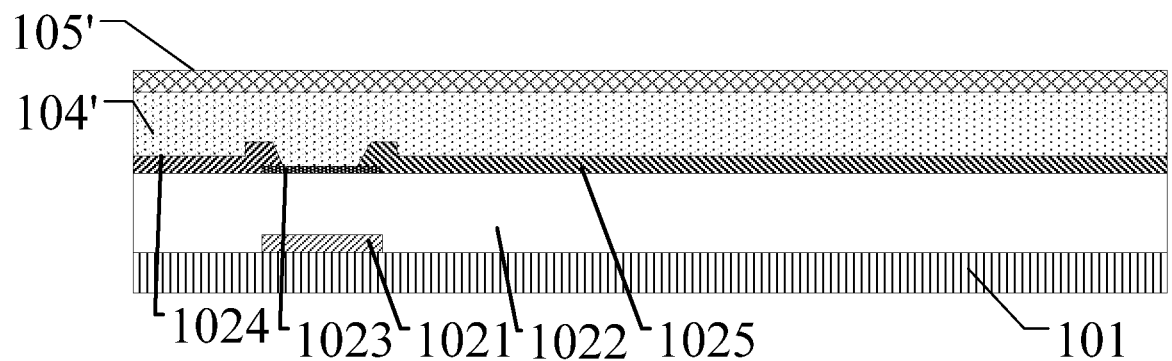
Figure 6F:
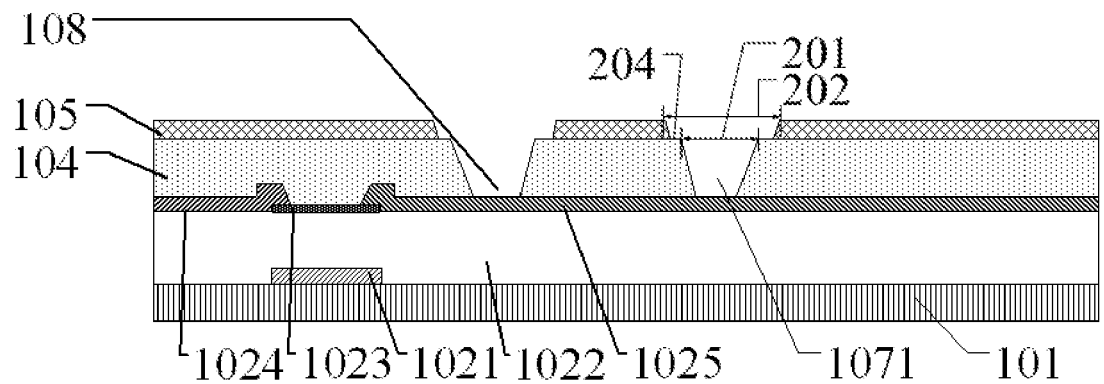

As illustrated in FIGS. 6e-6f, after the source electrode 1025 and the drain electrode 1024 are formed, a passivation layer film 104' and a first metal layer film 105' are deposited on the TFT in sequence. Subsequently, photoresist is coated on a surface of the first metal layer film 105' and patterned to form a photoresist pattern on the first metal layer film 105', and a first metal layer 105, a passivation layer 104, a first connecting hole 1071 and a recess 108 are formed on the TFT by patterning the first metal layer film 105' and the passivation layer film 104' by adoption of the photoresist pattern as an etching mask.

The material of the passivation layer film 104' includes an inorganic insulating film such as silicon nitride and silicon oxide, and the thickness of the passivation layer film is 0.15-0.25 μm, e.g., 0.2 μm. The passivation layer film is deposited by CVD. The material of the first metal layer film includes any one of Mo, Al or Cu or an alloy thereof, for example, aluminum-copper alloy (AlCu), aluminum-molybdenum alloy (AlMo), copper-molybdenum alloy (CuMo) or molybdenum-aluminum-copper alloy (MoAlCu).

For example, when the first metal layer film 105' and the passivation layer film 104' are patterned by adoption of the photoresist patterns as the etching mask, the first metal layer film 105' and the passivation layer film 104' may be etched by adoption of a first etching agent. The first etching agent is, for example, mixed corrosive ions, and is a mixed solution including ammonium fluoride ($NH_4F$), hydrofluoric acid (HF), etc. The source electrode below the passivation layer film can be guaranteed to be not etched by control of the etching time.

For example, the first metal layer film 105' and the passivation layer film 104' are respectively etched by a second etching agent and a third etching agent. The first metal layer film 105' and the passivation layer film 104' are etched via the same mask. After the first metal layer film is etched by the second etching agent, the third etching agent is adopted as the etching agent to etch the passivation layer film 104'.

For example, the second etching liquid includes: a solution formed by water, nitric acid, phosphoric acid and acetic acid, in which the content of each acid has a certain range of restriction. For example, the weight percentage of the nitric acid is 0.1%-4%; the weight percentage of the phosphoric acid is 50%-78%; and the weight percentage of the acetic acid is 0.1%-15%. In one example, the weight percentage of the nitric acid is, for example, 1.5%; the weight percentage of the phosphoric acid is, for example, 70%; the weight percentage of the acetic acid is, for example, 10%; and the remaining of the etching liquid is water, and the water is, for example, deionized water. Moreover, the etching liquid may further include an azole compound taken as an inhibitor, and a metal ion chelating agent configured to stabilize the etching rate. The metal ion chelating agent is, for example, citric acid, oxalic acid, ethylenediaminetetraacetic acid or trans-cyclohexene diamine tetraacetic acid.

For example, the third etching agent includes aqueous alkali such as potassium hydroxide (KOH) used for wet etching, and may also include gas such as $SF_6$ and $O_2$ used for dry etching.

For example, as illustrated in FIG. 6f, as the etching degree of the passivation layer 104 and the first metal layer 105 by the etching agent is not completely the same, a first step 204 is formed between the passivation layer 104 and the first metal layer 105. The first step 204 allows the first connecting holes 1071 to be smoother. The first connecting hole 1071 includes a first part and a second part. The first part and the second part respectively include a first size 201 and a second size 202 formed on a side of the passivation layer 104 and the first metal layer 105 away from the base substrate 101. The first size 201 is less than or equal to the second size 202.

Patterns of the first metal layer 105, the passivation layer 104, the first connecting hole 1071 and the recess 108 are formed by etching the first metal layer film and the passivation layer film via a first patterning process. Thus, the process steps are reduced, and meanwhile, the production cost is saved.

Figure 6G:
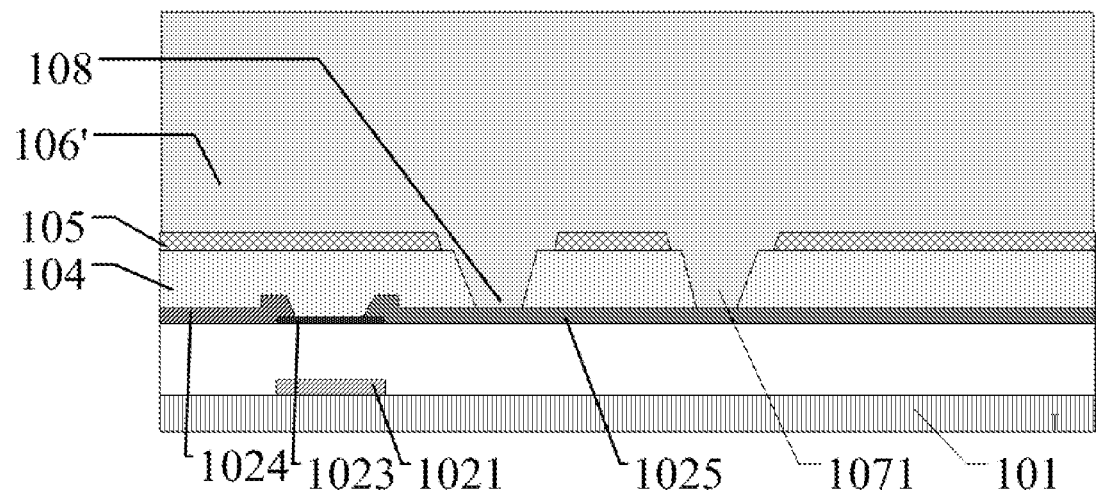
Figure 6H:
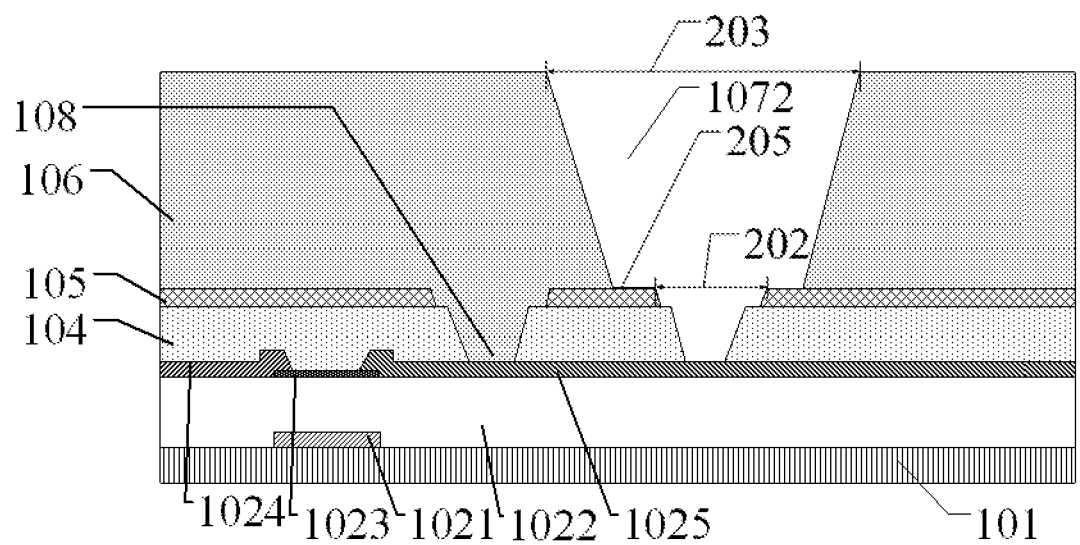

As illustrated in FIGS. 6g to 6h, an insulating layer film 106' is deposited on the base substrate 101 provided with the first metal layer 105, the passivation layer 104, the first connecting hole 1071 and the recess 108; and subsequently, photoresist is coated on a surface of the insulating layer film 106' and patterned to form photoresist patterns on the insulating layer film 106', and an insulating layer 106 and a second connecting hole 1072 are formed by patterning the insulating layer film by adoption of the photoresist patterns as an etching mask, in which the first connecting hole 1071 and the second connecting hole 1072 are communicated to form a through hole structure. The material of the insulating layer 106 is any one of organic resin, silicon nitride or silicon oxide.

For example, as illustrated in FIG. 6h, the second connecting hole 1072 includes a third part. The third part includes a third size 203 formed on a side of the insulating layer 106 away from the base substrate 101. The second size 202 is less than or equal to the third size 203, and a second step 205 is formed between the first metal layer 105 and the insulating layer 106. The second step 205 allows the through hole structure 107 to be smoother. Thus, the deposition of the second metal layer can be more favorably achieved, and meanwhile, the second metal layer can be more difficult to break, so that the conductivity of the second metal layer can be improved.

Figure 6I:
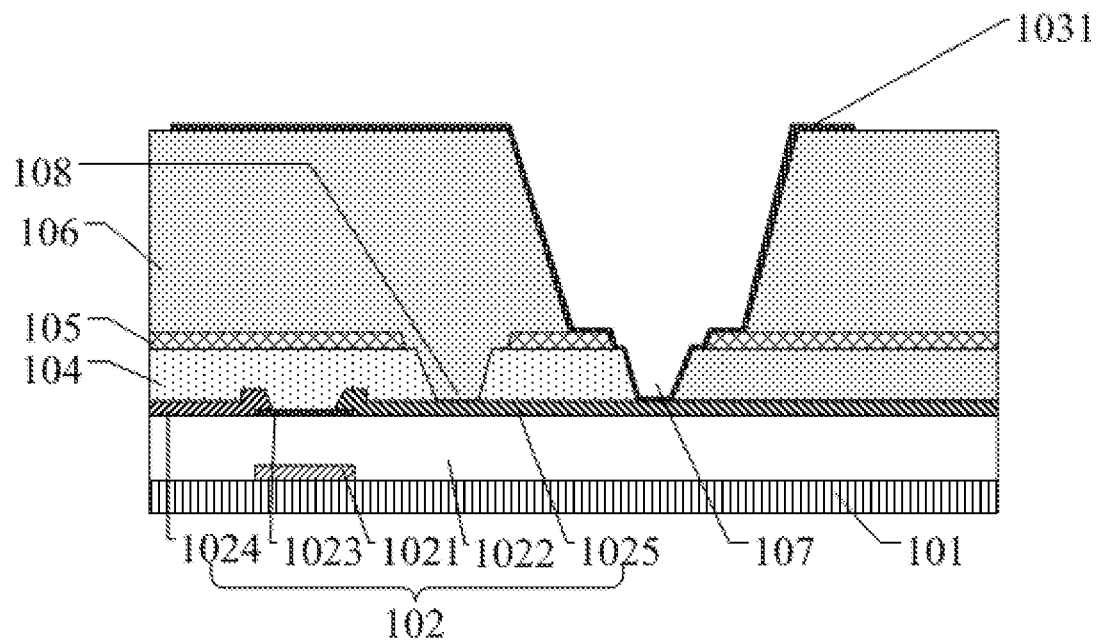

As illustrated in FIG. 6i, a second metal layer film (not illustrated) is deposited on the base substrate 101 provided with the through hole structure 107 and the insulating layer 106; and subsequently, photoresist is coated on a surface of the second metal layer film and patterned to form a photoresist pattern on the second metal layer film, and a pattern of the second metal layer 1031 is formed by patterning the second metal layer film by adoption of the photoresist pattern as an etching mask. The second metal layer 1031 and the source electrode 1025 make direct contact at the through hole structure 107. A bias electrode 1032 made from transparent or opaque materials is formed by the same patterning process. No further description will be give here.

For example, the manufacturing method of the array substrate may further comprise the step of forming a transparent conductive layer (not illustrated) on the second metal layer. For example, the transparent conductive layer may be ITO, AZO, IZO, transparent conductive resin, a graphene film, a carbon nanotube film, etc.

Figure 6J:
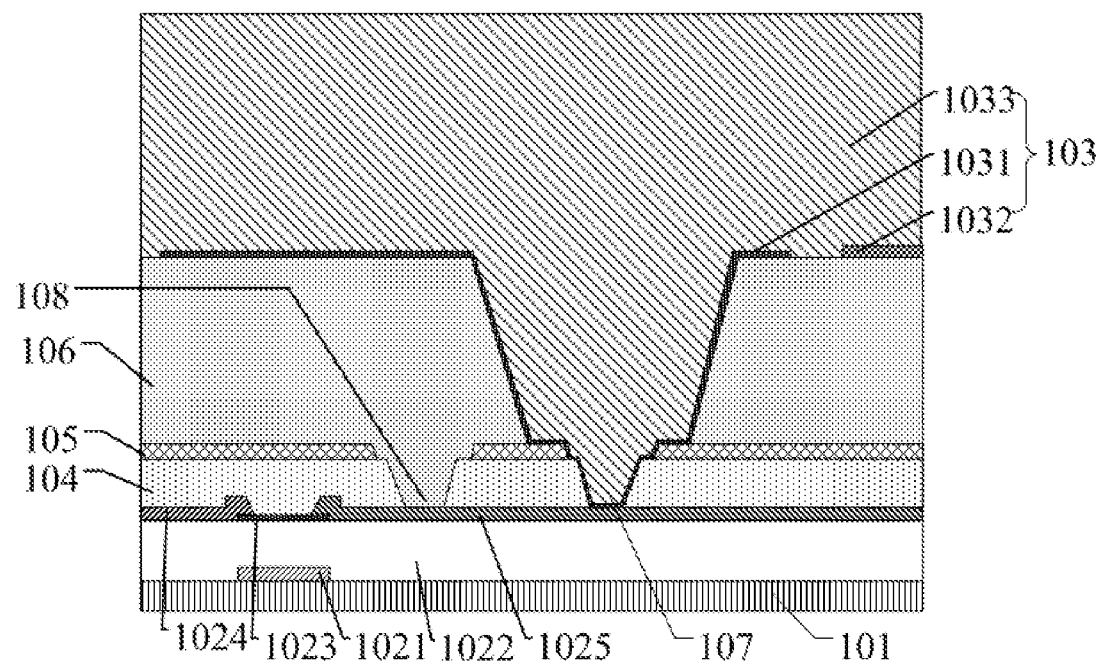

As illustrated in FIG. 6j, an a-Si semiconductor layer 1033 is formed on the base substrate 101 provided with the second metal layer 1031 and the bias electrode 1032.

Embodiments of the present invention provide an array substrate, a manufacturing method thereof, a sensor and a detection device. At least one embodiment of the present invention provides an array substrate, which comprises: a base substrate; a TFT being disposed on the base substrate and including a source electrode and an active layer; a passivation layer disposed on the TFT; a first metal layer disposed on the passivation layer; an insulating layer disposed on the first metal layer; a through hole structure running through the insulating layer, the first metal layer and the passivation layer; and a detection unit being disposed on the insulating layer and including a second metal layer, wherein the second metal layer makes direct contact with the source electrode via the through hole structure. The array substrate and the sensor and the detection device comprising the same have the following advantages: the array substrate may be applied to the sensor and the detection device; and in the manufacturing process of the array substrate, the first metal layer and the passivation layer may be patterned in the same patterning process, so the production processes are merged and production is convenient, and meanwhile, the production cost is saved.

The following points should be noted:

(1) For clarity, not all the structures of the array substrate, the sensor and the detection device are given. In order to achieve necessary functions of the sensor and the detection device, other structures not illustrated may be set by those skilled in the art according to specific applications. No limitation will be given here in the present invention. The accompanying drawings of the present invention also only involve structures relevant to the embodiments of the present invention, and other structures may refer to general design on the basis of the present invention.

(2) The characteristics in different examples of the present invention may be mutually combined without conflict.

The foregoing is only the preferred embodiments of the present invention and not intended to limit the scope of protection of the present invention. The scope of protection of the present invention should be defined by the appended claims.

The application claims priority to the Chinese patent application No. 201610229060.X, filed Apr. 13, 2016, the disclosure of which is incorporated herein by reference as part of the application.

The invention claimed is:

1. An array substrate, comprising:
a base substrate;
a thin-film transistor (TFT) being disposed on the base substrate and including a source electrode and an active layer;
a passivation layer disposed on the TFT;
a first metal layer disposed on the passivation layer;
an insulating layer disposed on the first metal layer;
a through hole structure running through the insulating layer, the first metal layer and the passivation layer; and
a detection unit being disposed on the insulating layer and including a second metal layer, wherein
the second metal layer makes direct contact with the source electrode via the through hole structure,
the array substrate further comprises:
a recess running through the first metal layer and the passivation layer and being disposed between the through hole structure and the active layer in a direction parallel to the base substrate, in which the first metal layer is disconnected at the recess to form different arts s aced from each other.

2. The array substrate according to claim 1, wherein a projection of the first metal layer on the base substrate is at least partially overlapped with a projection of the TFT on the base substrate.

3. The array substrate according to claim 1, wherein the detection unit further includes a bias electrode spaced from the second metal layer, and a semiconductor layer making contact with both the second metal layer and the bias electrode.

4. The array substrate according to claim 1, wherein a transparent conductive layer is disposed on the second metal layer.

5. The array substrate according to claim 4, wherein the transparent conductive layer has a thickness greater than that of the second metal layer.

6. The array substrate according to claim 5, wherein the transparent conductive layer includes any one of indium tin oxide (ITO) or indium zinc oxide (IZO).

7. The array substrate according to claim 1, wherein a material of the insulating layer is any one of organic resin, silicon nitride or silicon oxide.

8. The array substrate according to claim 7, wherein a thickness of the insulating layer is 1-4 μm.

9. The array substrate according to claim 1, wherein a material of the first metal layer and the second metal layer is any one or a combination of molybdenum (Mo), aluminum (Al) or copper (Cu).

10. A sensor, comprising the array substrate according to claim 1.

11. A detection device, comprising the sensor according to claim 10.

* * * * *